United States Patent
Freed

(10) Patent No.: US 6,789,034 B2
(45) Date of Patent: Sep. 7, 2004

(54) DATA COLLECTION METHODS AND APPARATUS WITH PARASITIC CORRECTION

(75) Inventor: Mason L. Freed, Walnut Creek, CA (US)

(73) Assignee: OnWafer Technologies, Inc., Dublin, CA (US)

( * ) Notice: Subject to any disclaimer, the term of this patent is extended or adjusted under 35 U.S.C. 154(b) by 0 days.

(21) Appl. No.: 10/126,429

(22) Filed: Apr. 19, 2002

(65) Prior Publication Data

US 2002/0193957 A1 Dec. 19, 2002

Related U.S. Application Data

(60) Provisional application No. 60/285,613, filed on Apr. 19, 2001, and provisional application No. 60/285,439, filed on Apr. 19, 2001.

(51) Int. Cl.[7] ............. G06F 19/00; G01D 18/00
(52) U.S. Cl. ............. 702/104; 702/65; 702/90
(58) Field of Search ............... 702/57, 60, 64, 702/65, 90–91, 104, 106–107, 126; 365/105, 175, 243; 257/529, 530

(56) References Cited

U.S. PATENT DOCUMENTS

| | | | |
|---|---|---|---|
| 4,374,384 A | 2/1983 | Moates | 340/870.38 |
| 4,516,223 A * | 5/1985 | Erickson | 365/175 |
| 4,954,989 A * | 9/1990 | Auberton-Herve et al. | 365/177 |
| 5,729,905 A * | 3/1998 | Mathiasmeier et al. | 33/3 R |
| 5,907,820 A | 5/1999 | Pan | 702/155 |
| 5,959,309 A | 9/1999 | Tsui et al. | 257/48 |
| 5,967,661 A | 10/1999 | Renken et al. | 374/126 |
| 5,969,639 A | 10/1999 | Lauf et al. | 340/870.17 |
| 6,244,121 B1 | 6/2001 | Hunter | 73/865.9 |
| 6,387,329 B1 | 5/2002 | Lewis et al. | 422/98 |
| 6,542,835 B2 * | 4/2003 | Mundt | 702/65 |

FOREIGN PATENT DOCUMENTS

WO   WO 02/17030 A2   2/2002

OTHER PUBLICATIONS

U.S. application # 09/816,648 Filed Mar. 22, 2001.
U.S. application # 60/285,613 Filed Apr. 19, 2001.
U.S. patent application # 60/285,613 Filed Apr. 19, 2002.

* cited by examiner

Primary Examiner—Bryan Bui
(74) Attorney, Agent, or Firm—Larry Williams

(57) ABSTRACT

Information transfer is effected using a network of electrical signal conductors and sensors forming crosspoint connections. The sensors are capable of representing a measurement parameter as an electrical impedance. One embodiment of the present invention includes output electrical conductors, input electrical conductors, and sensors. Each of the sensors is connected with one of the output electrical conductors and one of the input electrical conductors so as to form an array of crosspoint connections. Application of electrical signals to the sensors and measurement of electrical signals from the sensors provide sufficient information to derive relative information corrected for parasitic current sources for each sensor using algorithms based on equations for combining impedance. The embodiment may further include one or more reference elements connected with the output electrical conductors and with the input electrical conductors so as to form crosspoint connections. The reference elements have predetermined impedances and may be used to determine the impedance values for particular sensors.

20 Claims, 6 Drawing Sheets

DATA COLLECTION METHODS AND APPARATUS WITH PARASITIC CORRECTION

CROSS-REFERENCE

The present application claims benefit of U.S. patent application Ser. No. 60/285,613 filed on Apr. 19, 2001 and U.S. patent application Ser. No. 60/285,439 filed on Apr. 19, 2001. The present application is related to U.S. patent application Ser. No. 60/285,613 filed on Apr. 19, 2001, U.S. patent application Ser. No. 60/285,439 filed on Apr. 19, 2001, U.S. patent application Ser. No. 09/643,614, filed on Aug. 22, 2000 also published as Patent Corporation Treaty application WO 02/17030, and U.S. patent application Ser. No. 09/816,648, filed on Mar. 22, 2001; all of these applications are incorporated herein, in their entirety, by this reference.

BACKGROUND

This invention relates to improved methods and apparatus for collecting information, more particularly, electronically collecting data from multiple locations such as, for example, data collection from an array of sensors.

The successful and cost effective manufacture of many common components (e.g. integrated electronic circuits) requires that processing conditions or properties be maintained at optimal values over relatively large areas or volumes. The ability to obtain process condition data from many, discrete locations within a processing system (i.e. spatially resolved data) is very valuable in establishing and maintaining optimal component yields and performance. Further, many common processing operations require that process variables change in a consistent, reproducible way as a function of time (i.e. process trajectory) rather than have a single, time independent value. The ability to obtain process condition data at many, discrete points in time (i.e. temporally resolved data) is also very valuable in establishing and maintaining optimal component yields and performance.

Most sensors and sensing methods either obtain data at discrete physical locations (e.g. thermocouples measuring temperature) or measure an average (or integrated) value for the entire process area or volume (e.g. optical emission from a plasma discharge). These limitations are usually an inherent property of the sensor and/or measurement parameter. There are a number of standard methods and approaches that have been developed in an attempt to obtain spatially and temporally resolved process data, each of which has its own set of strengths and weaknesses. Descriptions of some methods that have been used can be found in United States patents U.S. Pat. Nos. 5,907,820, 5,959,309, 5,967,661, and 6,244,121.

Clearly, there are numerous applications requiring high accuracy methods and apparatus for spatially resolved and time resolved data collection from one or more sensors. Still further, there is a need for methods and apparatus that enable limited data acquisition and measurement resources to be more efficiently shared by a large number of sensors.

SUMMARY

This invention pertains to improve data acquisition such as for mapping one or more parameters spatially, temporally, or spatially and temporally. Practicing aspects of the present invention includes data collection steps of activating multiple crosspoint nodes by applying electrical signals to the crosspoint nodes simultaneously and making measurements for one or more activation states. Parasitic correction measurements are also performed. The parasitic correction measurements are applied to the data from the data collection steps so as to obtain corrected data. Data representing the condition of one or more nodes are then mathematically extracted from the set of corrected data.

One aspect of the present invention includes apparatus for acquiring data. In one embodiment, the apparatus includes output electrical conductors, input electrical conductors, and sensors. The sensors are capable of presenting a measured parameter as an electrical impedance. Each of the sensors is connected with one of the output electrical conductors and one of the input electrical conductors so as to form an array of crosspoint connections. Applying electrical signals to the output electrical conductors and measuring electrical signals at the input electrical conductors, generates sufficient information to correct for parasitic current sources and derive the measured parameter of each sensor using algorithms that include equations for combining electrical impedances. The apparatus also includes a controller for applying the electrical signals, for measuring the electrical signals, and for deriving the parasitic source correction for the measured parameter.

Another aspect of the present invention includes methods of acquiring data. In one embodiment, the method is used for obtaining data from an array of sensors in a crosspoint network. The sensors are capable of representing one or more measured parameters as electrical impedance. The method includes the step of applying a pattern of electrical signals to the sensors. The method also includes measuring electrical signals from the sensors. Still further, the method includes the step of deriving measurement data corrected for parasitic sources for each of the sensors; the step includes using the corrected measured electrical signals and algorithms that include equations for combining electrical impedances.

Another aspect of the present invention includes a computer-implemented algorithm for deconvolving combined electrical impedances from an array of sensors. The algorithm is derived from equations that represent combined discrete impedances. The equations are manipulated to obtain a set of equations having the number of unknowns equal to or less than the number of equations. The algorithm further includes the mathematical steps for applying parasitic current source corrections and for solving the equations using measured electrical data representing the combined impedances and measurement data representing the parasitic current source.

It is to be understood that the invention is not limited in its application to the details of construction and to the arrangements of the components set forth in the following description or illustrated in the drawings. The invention is capable of other embodiments and of being practiced and carried out in various ways. In addition, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out aspects of the present invention. It is important, therefore, that the claims be regarded as including such equivalent constructions insofar as they do not depart from the spirit and scope of the present invention.

DESCRIPTION

Figure 1:
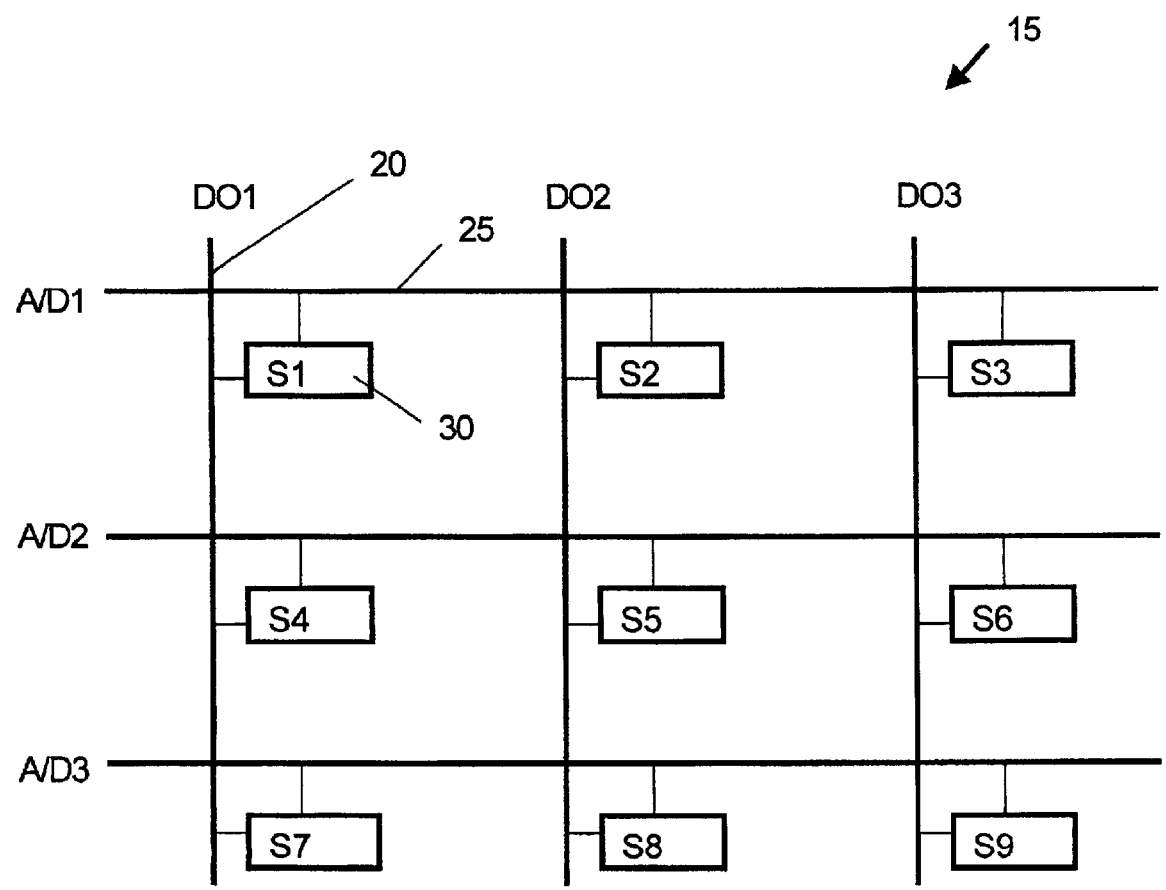
FIG. 1 is a diagram of an embodiment of the present invention.

The operation of embodiments of the present invention will be discussed below, primarily, in the context of obtaining information from an array of sensors. However, it is to be understood that embodiments in accordance with the present invention are not limited to sensor applications.

In the following description of the figures, identical reference numerals have been used when designating substantially identical elements or steps that are common to the figures.

Practicing embodiments of the present invention includes activating multiple sensors by applying electrical signals to the sensors (i.e. crosspoint nodes) simultaneously and making measurements for each activation state. For example, if the activation involves a current, then current flows through all sensors during every measurement. The value at each sensor is then mathematically extracted from the set of measurement data. No single measurement contains data from only one sensor; each measurement has a mixture of data from each sensor. The embodiments also include capabilities for making corrections for parasitic current sources.

Embodiments of the disclosed invention may include at least one input electrical conductor, at least two output electrical conductors, and at least two sensors. The conductance characteristics (I-V behavior) of the sensors are a function of a parameter to be measured. The electrical conductors and sensors are arranged to form a crosspoint array wherein the rows (horizontal conductors) are formed by the input electrical conductors, the columns (vertical conductors) are formed by the output electrical conductors, and the sensors are connected between the output electrical conductors and the input electrical conductors at each crossing point (nodes).

To better illustrate embodiments of the present invention, reference is now made to FIG. 1 wherein there is shown a diagram for a sensor array 15 according to an embodiment of the present invention. Sensor array 15 includes three output electrical conductors 20, three input electrical conductors 25, and nine sensors 30. Each of the sensors 30 are connected with one of the output electrical conductors 20 so that sensors 30 can receive electrical signals via output electrical conductors 20. In addition, each of the sensors 30 is connected with one of the input electrical conductors 25 so that sensors 30 can send electrical signals via input electrical conductors 25. This arrangement results in a network where sensors 30 serve as crosspoint connections between output electrical conductors 20 and input electrical conductors 25.

A variety of electrically conductive materials and material configurations are suitable for use in output electrical conductors 20 and input electrical conductors 25. For example, conductors 20 and conductors 25 may comprise conducting wires such as bulk wires, fine gauge wires, and electrical conductors formed by thin film techniques.

Depending on the nature of conductors 20 and conductors 25, the conductors may serve as a frame for supporting sensors 30 in some embodiments. Such a configuration would be suitable for embodiments where the electrical conductors are rugged enough and large enough to serve in this capacity. In alternative embodiments, the sensors may be supported on a separate substrate (not shown in FIG. 1). As a further embodiment, the electrical conductors may be formed on the surface of the substrate and arranged so that they form the electrical connections between the sensors.

Sensors 30 may include any type of sensors capable of representing a measured parameter as an electrical impedance. Suitable sensors include sensors that directly present electrical impedance values related to the measured parameter. Other suitable sensors include sensors having circuitry capable of transforming information representing the measured parameter into a corresponding electrical impedance.

The impedance exhibited by the sensors may include any one or combinations of resistance, capacitance, and inductance. Examples of suitable sensors include sensors such as thermistors, photoresistors, photoconductors, photodiodes, and sensors that include active electronic devices, nonlinear electronic junctions, MOSFET devices, and ion sensitive membranes.

If sensors 30, shown in FIG. 1, are assumed to be thermistors then an embodiment of a suitable method for using sensor array 15 may include the following steps. Electrical signals such as, for example, a pattern of high and low voltages are applied to output conductors 20, labeled DO lines. In preferred embodiments, there are at least one high output voltage and at least one low output voltage. In other words, there are at least two discrete voltages for the source states. Preferably, output conductors 20, the DO lines, have significantly lower impedance than sensors 30; this is assumed to be true for this example embodiment. An example pattern of high and low voltages for the embodiment shown in FIG. 3 may include a high voltage, Vhigh, on output conductor 20 indicated as DO1 and low voltages, Vlow, on output conductors 20 indicated as DO2 and DO3.

Voltage measurements are made on input electrical conductors 25, labeled A/D1 through A/D3. Preferably, the voltage measurement hardware has significantly higher impedance than the sensors; this is assumed to be true for this example embodiment. This embodiment of the present invention further includes the step of performing additional voltage measurements so as to derive corrections for errors in the voltage measurements caused by parasitic current sources.

The voltage appearing at input electrical conductor 25, labeled A/D1, will thus be determined by the resistive voltage divider formed by the resistance of sensor 30, labeled S1, in series with the parallel combination of the resistances of sensors 30, labeled S2 and S3. Consequently, the equation for the voltage V(A/D1) at input electrical conductor 25, labeled A/D1, is given by equation (a), $$V(A/D1) = V_{low} + (V_{high} - V_{low})\frac{S2S3}{S1S2 + S1S3 + S2S3} \quad (a)$$

where in this equation:

S represents resistance,

Resistance of S2 and S3 in parallel=(S2*S3)/(S2+S3),

Total resistance=(S1+(S2*S3)/(S2+S3)).

In a similar manner, the voltages appearing at input electrical conductors 25, labeled A/D2 and A/D3, are functions of sensors 30, S4 through S9. As various patterns of voltages $V_{high}$ and $V_{low}$ are applied to output electrical conductors 20, similar relationships between the voltages measured at input electrical conductors 25 and resistance information for sensors 30 can be derived. After the set of measurements have been corrected for the error caused by parasitic current sources, well-known linear algebra techniques and the corrected set of measurements, can be used to obtain ratios that equal the resistance values for each sensor 30 and any other sensor 30 directly connected to the same input electrical conductor 25. In other words, the ratios indicate changes in the measurements provided by the sensors. Spatially resolved parameter maps and temporally resolved parameter maps can be obtained showing the relative changes in the parameter measurements for each sensor without the errors caused by the presence of parasitic current sources.

It is to be understood that embodiments of the present invention can be used to measure relative information for substantially any sensor wherein the sensor measurements can be expressed as electrical impedance and there is a change in impedance, either real (resistance) or imaginary (capacitive or inductive) or a mixture of the two.

Additional examples of patterns of high and low voltages that can be used to obtain sets of measurements are: all voltages low except one, such as LLLLLHLLLLLL; every other voltage high, such as LHLHLHLHLHLH; all voltages high except one, such as HHHHHHLHHHHH; and any other combination of voltages where at least one line is at high voltage and at least one line is at low voltage. Preferred patterns will depend upon the characteristics of the sensors at the nodes. A more complex activation pattern may be needed for sensors that have highly nonlinear responses such as for example the responses for Zener diodes. For parameter measurements using some types of nonlinear sensing elements, the output stimulus patterns cannot be predefined. In some embodiments of the present invention, the electrical signals applied to the sensors need to be continuously increased or "ramped" until a discernable change is detected on the input electrical conductors.

For imaginary impedance, a high voltage case would mean applying a specific amplitude AC signal to a line and a low voltage would be a different, lower amplitude AC signal. For ease of generation and analysis, the frequencies for the high and low voltages, preferably, would be the same.

One embodiment of the present invention uses approximately 3 volts as a high voltage and near 0 volts, such as at about ground, as a low voltage. For accurate parameter measurements, it is preferable to be able to measure with reasonable accuracy the values of voltages between the high and low points. The specific selection of a high and low is usually set by factors such as what voltages are available, what voltages the sensors require for operation, and the preferred voltage range for analog to digital conversion.

The number of sensors that can be measured using embodiments of the present invention is thus the product of the number of input electrical conductors and the number of output electrical conductors. In the example just given, nine sensors were accommodated with three output electrical conductors and three input electrical conductors. Similarly, 25 sensors can be accommodated with five output electrical conductors and five input electrical conductors, and 100 sensors can be accommodated with the 10 output electrical conductors and 10 input electrical conductors. Consequently, embodiments of the present invention allow large numbers of sensors to be networked to provide information using a relatively small number of input and output electrical conductors.

For comparison, mapping parameters with an array of 100 sensors, according to standard mapping technology, would require an input line and an output line for each sensor for independently wired sensors. In other words, 200 electrical lines would be required. However, embodiments of the present invention can provide an equivalent amount of mapping capabilities using only 20 electrical lines. Embodiments of the present invention can significantly reduced the number of electrical lines and reduced the general complexity of wiring sensor arrays.

The reduction in wiring complexity that can be provided by embodiments of the present invention is particularly important in certain applications where a large number of sensors are needed in a relatively small area or volume. For example, parameter mapping for applications related to processing electronic devices might require a large number of sensors arranged in an area the size of typical workpieces for such applications. Specifically, for typical present day semiconductor processing this means an area about equal to the size of a typical semiconductor wafer, an area having a diameter of from about 100 mm to about 300 mm.

In addition, for some applications it is desirable to have the sensor apparatus as non-intrusive as possible. Preferably, the sensor apparatus should provide little or no perturbation to the parameter measurements. Reducing the amount of required wiring and the complexity of the wiring is beneficial in this regard. In other words, embodiments of the present invention can offer additional benefits of reducing the possibility of measurement perturbations because the wiring requirements are far simpler than some of the standard technologies.

Still another advantage of the simpler wiring requirements for embodiments of the present invention is the reduced fabrication complexity. Not only is the actual fabrication easier, the post fabrication testing and quality assurance is simpler also because there are fewer electrical lines to be examined.

In another embodiment of the present invention, the information for each sensor can be obtained directly. In other words, the impedance value for each sensor can be determined rather than obtaining ratios of impedances. This means that the impedances can be converted to indicate values for the parameter being measured. The capability of obtaining impedance values for each sensor is the result of hardware modifications to the sensor array. For illustration, reference is now made to FIG. 1a wherein there is shown sensor array 15 having output electrical conductors 20, input electrical conductors 25, and sensors 30. Output electrical conductors 20, input electrical conductors 25, and sensors 30 are all essentially the same as those described for the embodiment illustrated in FIG. 1 with the exception that there are six sensors 30 added to the network are three reference elements 35 labeled as R1, R2, and R3 in FIG. 1a. Reference elements 35 are connected to output electrical conductors 20 and input electrical conductors 25 to form crosspoint connections therebetween. In other words, reference elements 35 form crosspoint connections in essentially the same way that sensors 30 form crosspoint connections between output electrical conductors 20 and input electrical conductors 25. Preferably, reference elements 35 populate each crossing point along one of the output conductor lines 20.

Reference elements 35 have predetermined impedances. Preferably, the predetermined impedances result from reference elements 35 having a substantially constant impedance with respect to the parameter being measured. The predetermined impedances of reference elements 35 can be incorporated into the equations used for deriving the measurement parameters for each of the sensors. Including information for reference elements 35 reduces the number of unknowns. This permits calculation of information for each of the sensors as ratios of the sensor impedances to the reference element impedances. The impedances for the reference elements are predetermined, thus, allowing the impedances of the sensors to be determined using the ratios.

Including reference elements with predetermined resistance values in the example given earlier where the sensors are thermistors creates a special case for the calculations. In this special case, the ratio of the sensor resistance to the reference resistance is identical to the ratio of the measured voltages. The resistance values for each of the sensors can be obtained using the voltage ratios and the predetermined resistances for the reference elements. The following illustrative example provides more details and example equations.

Figure 1A:
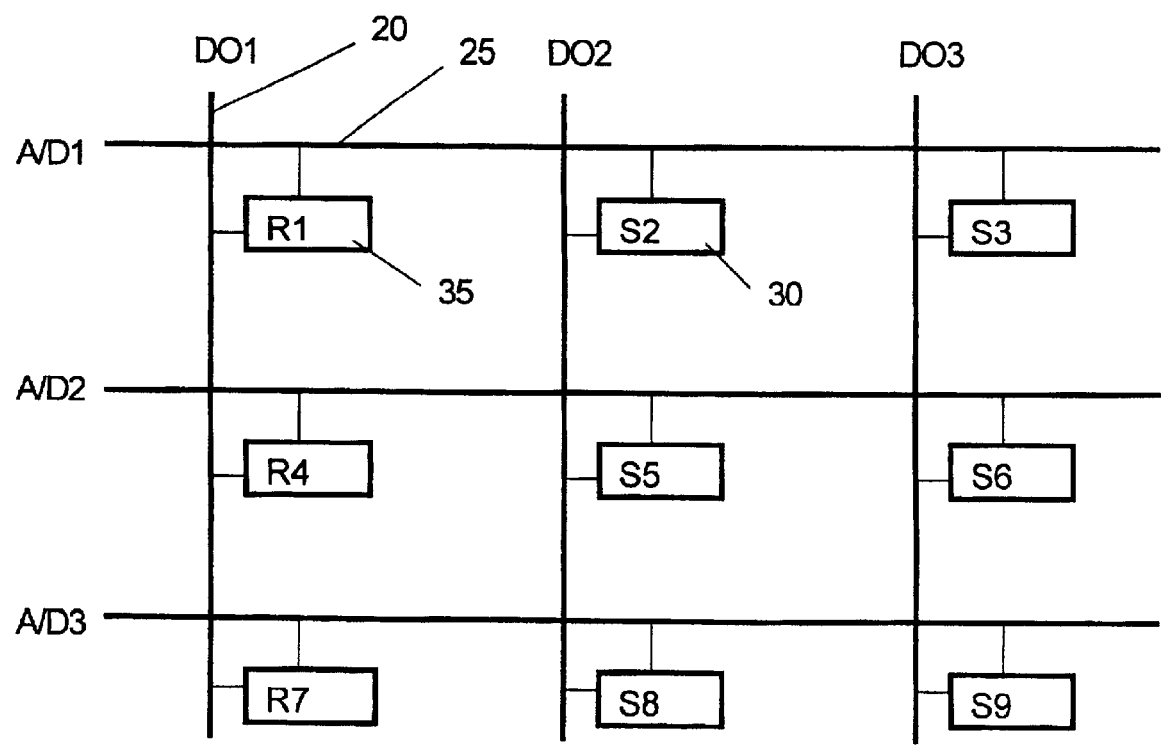
FIG. 1a is a diagram of an embodiment of the present invention.

Referencing FIG. 1a, if one of the output electrical conductors 20 is brought to high voltage, $V_{high}$, and the other output electrical conductors 20 are held to about electrical ground, an equivalent circuit can be used to describe the electrical characteristics of each input electrical conductor 25. In an example set of measurements, a pattern of electrical signals brings each of the output electrical conductors 20 to $V_{high}$ once, and the resultant voltage at the input electrical conductors 25 are recorded. The voltage developed at input electrical conductors 25 when reference elements 35 are brought to $V_{high}$ is given by equation (b):

$$V_s = \frac{\frac{R_p R_r}{R_p + R_r}}{\frac{R_p R_r}{R_p + R_r} + R_s} Vhigh = \frac{R_p R_r}{R_p R_r + R_s(R_p + R_r)} Vhigh \quad (b)$$

where:

$R_r$ is resistance of the reference element, $R_s$ is resistance of a single sensor, $R_p$ is parallel resistance of the other sensors, and Vhigh is $V_{high}$.

Similarly, the equation that gives the analog voltage for the case when the sensor is brought to $V_{high}$ is equation (c):

$$V_r = \frac{R_p R_s}{R_p R_s + R_r(R_p + R_s)} V_{dd} \quad (c)$$

Dividing these two equations results in the following relation, equation (d):

$$\frac{V_r}{V_s} = \frac{\frac{R_p R_s}{R_p R_s + R_r(R_p + R_s)} V_{dd}}{\frac{R_p R_r}{R_p R_r + R_s(R_p + R_r)} V_{dd}} = \frac{\frac{R_p R_s}{R_p R_s + R_r R_p + R_r R_s}}{\frac{R_p R_r}{R_p R_r + R_s R_p + R_s R_r}} = \frac{R_s}{R_r} \quad (d)$$

Therefore, by finding the ratio of the voltages for the two measurements and using the known resistance of the reference element, the unknown sensor resistance can be computed.

Figure 2:
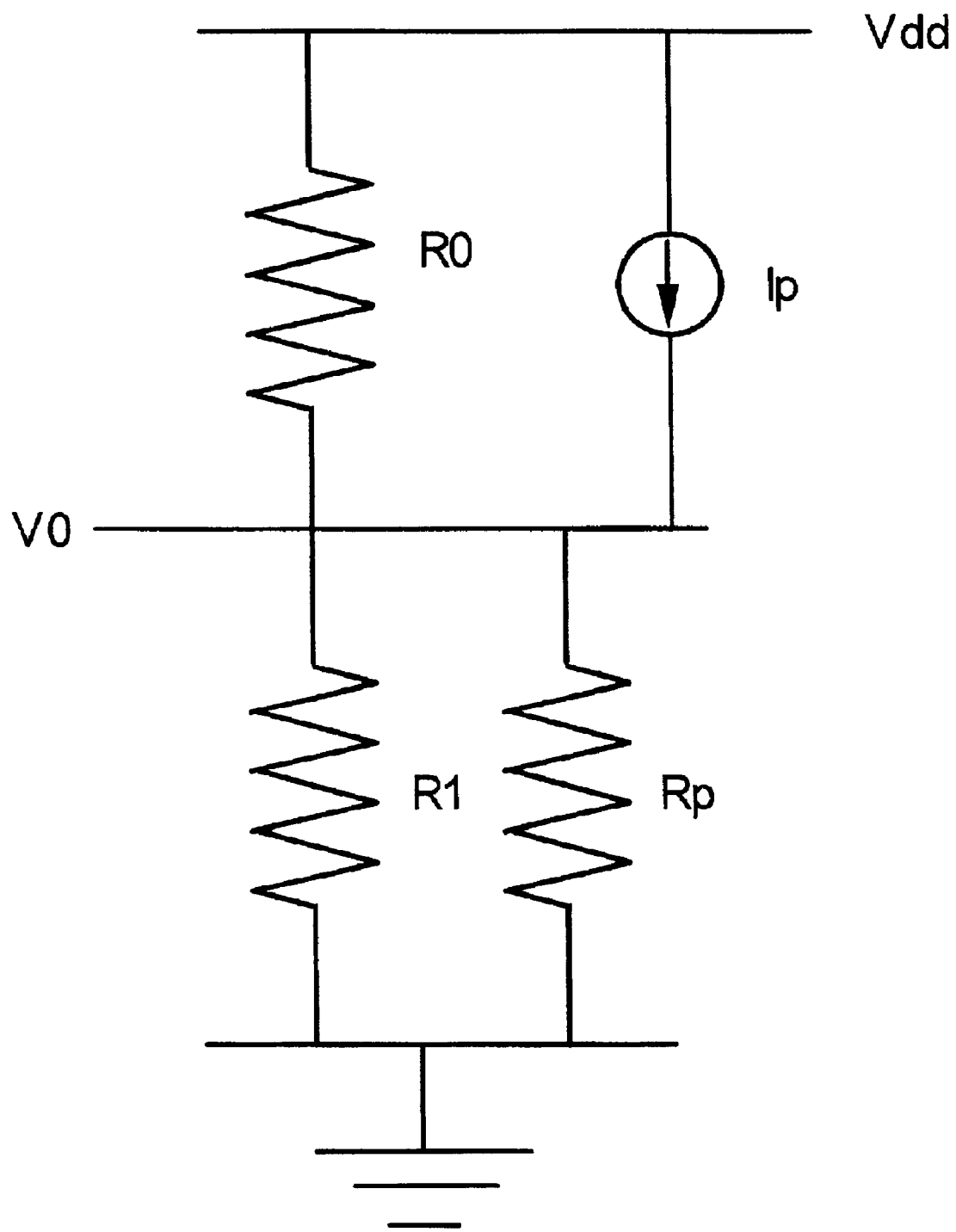
FIG. 2 is a circuit diagram showing parasitic current source.

Reference is now made to FIG. 2. For some applications of embodiments of the present invention, there may be a parasitic current source on the analog input lines as shown in FIG. 2. FIG. 2 illustrates an example of the parasitic current source in a circuit diagram like that for embodiments of the present invention. In the case shown in FIG. 2, the current source $I_p$ distorts the measurement value by forcing extra current into the lower legs of the matrix. This artificially inflates the measured voltage $V_0$ and corrupts the measurement.

The parasitic current source can come from many sources. One common such source is the pin leakage current on the analog input of the measuring device, such as a microprocessor, used to measure $V_0$. Other parasitic current sources can be caused by the particular hardware configuration used to form the measurement matrix. The presence of the parasitic current source can cause errors in the measured values leading to reduced accuracy for the final information.

Embodiments of the present invention include methods of canceling the effects of the parasitic current source, thereby restoring the accuracy of the measurements. In other words, methods according to embodiments of the present invention are capable of effectively canceling the effect of substantially any parasitic current source on the analog input line.

The following assumptions were used for obtaining an embodiment of the present invention. The assumptions are for a matrix of resistors like those described for FIG. 1a. The first assumption is that there is a current source that injects current into the analog line while the measurement is taking place. The value of the current is unknown, and the current may vary slowly with temperature and supply voltage. The current source substantially does not change value during the course of a single scan of an analog channel. For example, the current source is essentially constant over time periods of ~50 ms.

The voltage, $V_0$, measured on the analog channel for the assumptions is given by the equations (1) and (2).

$$\frac{(Vdd - V_0)}{R_0} + I_p - \frac{V_0}{R_1} - \frac{V_0}{R_p} = 0 \quad (1)$$

$$\Rightarrow V_0 = (R_0 // R_1 // R_p)\left(\frac{V_{dd}}{R_0} + I_p\right) \quad (2)$$

Taking two such measurements, giving voltages $V_0$ and $V_1$, leads to equation (3).

$$\frac{V_0}{V_1} = \frac{(R_0 // R_1 // R_p)\left(\frac{V_{dd}}{R_0} + I_p\right)}{(R_0 // R_1 // R_p)\left(\frac{V_{dd}}{R_1} + I_p\right)} = \frac{(V_{DD} + R_0 I_p) R_1}{(V_{DD} + R_1 I_p) R_0} \quad (3)$$

Equation (3) shows the dependence of $V_0/V_1$ on the current $I_p$. In addition, equation (3) shows that $V_0/V_1$ is dependant on $V_{dd}$. Both of these dependences will corrupt the measurement of $R_0$ and $R_1$. Methods according to embodiments of the present invention substantially eliminate the effects of the parasitic current source.

Figure 3:
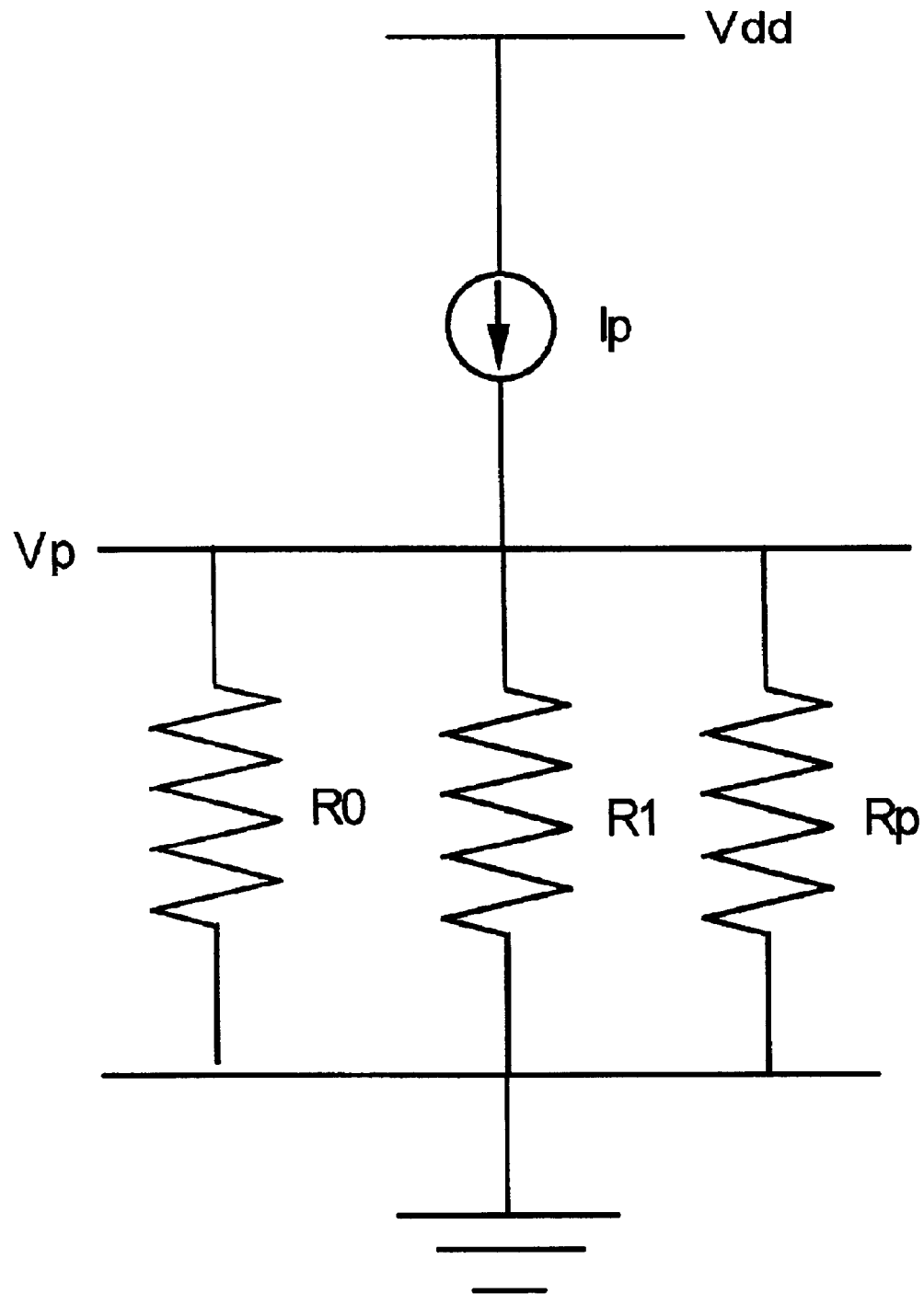
FIG. 3 is a circuit diagram for a measurement for an embodiment of the present invention.

Reference is now made to FIG. 3 wherein there is shown a circuit diagram for use with an embodiment of the present invention. FIG. 3 shows resistors connected in parallel such as those described for FIG. 1a. One of the steps in the method includes measuring a voltage $V_p$ for the parallel resistors while voltage $V_{dd}$ is applied to one side of the parallel resistors and the other side of the parallel resistors is held at ground. In other words, the method includes the step of performing another measurement, referred to here as a parasitic correction measurement, in addition to the measurements described for FIG. 1 and FIG. 1a. For the parasitic correction measurement, voltage $V_p$ is measured when all of the digital output ports are driven to ground level (as opposed to the "normal" measurement configuration whereby one of the digital output ports is driven to $V_{dd}$). The measurement of voltage $V_p$ is performed for each analog channel connected with the matrix of resistances.

Analytically, $V_p$ is determined by equation (4).

$$V_p = I_p(R_0 \| R_1 \| R_p) \quad (4)$$

Combining equation (3) and equation (2) yields equations (5) and (6).

$$V_0 = (R_0 \| R_1 \| R_p)\frac{V_{dd}}{R_0} + V_p \quad (5)$$

$$\Rightarrow \frac{V_{dd}}{V_0 - V_p} = \frac{R_0}{(R_0 \| R_1 \| R_p)} \quad (6)$$

Equation (6) can be written for voltage $V_0$ and another equation (6) can be written for voltage $V_1$. Dividing equation (6) for $V_0$ by equation (6) for $V_1$ yields equation (7). Equation (7) simplifies into equation (8).

$$\frac{V_{dd}/(V_0 - V_p)}{V_{dd}/(V_1 - V_p)} = \frac{R_0/(R_0 \| R_1 \| R_p)}{R_1/(R_0 \| R_1 \| R_p)} \quad (7)$$

$$\frac{R_0}{R_1} = \frac{(V_1 - V_p)}{(V_0 - V_p)} \quad (8)$$

Equation (8) shows the correct ratio of the resistance $R_0$ and the resistance $R_1$ is determined by the measured voltages $V_0$, $V_1$, and $V_p$. The ratio shown in equation (8) is corrected for the parasitic current source. To compensate for the effect of the parasitic current source, the method includes the step of subtracting the appropriate parasitic voltage measurement $V_p$ from each corresponding voltage measurement before dividing the measured voltages to find the ratio of resistances. The method described for this embodiment of the present invention will account for substantially any slowly occurring variations in parasitic current $I_p$; the method will also render the resultant values insensitive to the supply voltage.

Figure 4:
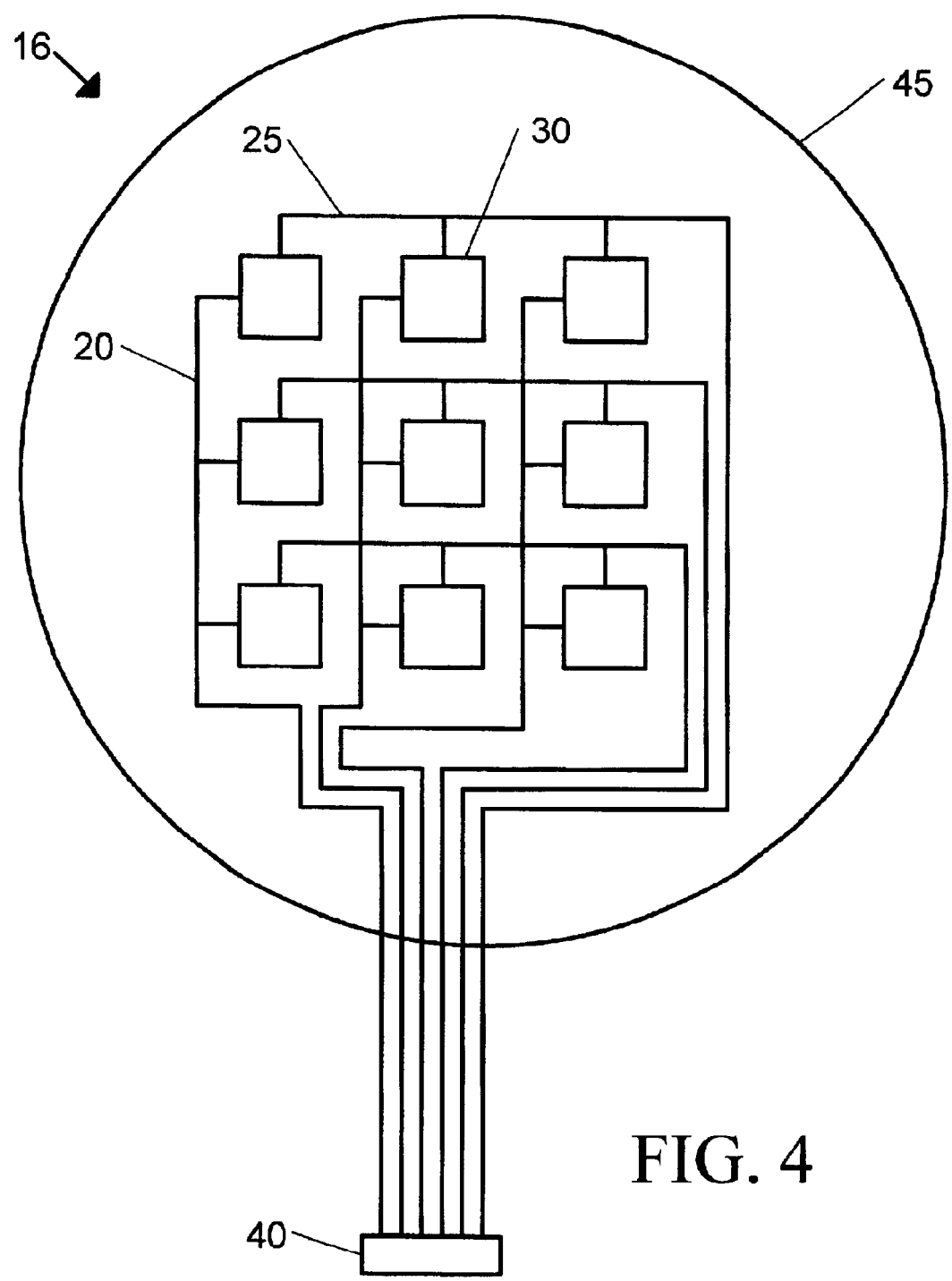
FIG. 4 is a diagram of an embodiment of the present invention.

Reference is now made to FIG. 4 wherein there is shown a top view of an embodiment of the present invention. A sensor apparatus 16 is shown having output electrical conductors 20, input electrical conductors 25, and sensors 30. Conductors 20, conductors 25, and sensors 30 are essentially the same as those described for the embodiment shown in FIG. 1.

Sensor apparatus 16 further includes a controller 40. Controller 40 is connected with output electrical conductors 20. Controller 40 is capable of applying electrical signals to sensors 30 via output electrical conductors 20. Controller 40 is also connected with input electrical conductors 25 so that controller 40 can measure electrical signals from sensors 30 via input electrical conductors 25. Controller 40 is capable of performing the measurements for deriving corrections for parasitic sources. In other words, controller 40 is capable of measuring electrical signals and applying electrical signals.

Those skilled in the art are aware that there are numerous commercially available controllers that are suitable for controller 40. In addition, a variety of types of controllers are commercially available that can be used for controller 40. In one embodiment, controller 40 may include electronic devices such as microprocessors for controlling the measurement of electrical signals from input conductors 25 and for controlling the application of electrical signals to output conductors 20. Furthermore, controller 40 may include computer readable memory for storing data and instructions. Still further, controller 40 may be capable of transmitting data and instructions to a second location. In other embodiments, controller 40 may comprise a computer such as for example a personal computer. Optionally, the personal computer may be included in a computer network.

In another embodiment, controller 40 includes two separate but coordinated control systems. One control system generates the pattern of electrical outputs to the sensors, and the other control system measures the electrical signals from the sensors.

In some embodiments, controller 40 may be located remotely from sensors 30. This embodiment may be preferred in applications where the mapping parameters include extreme conditions compared to conditions suitable for the functioning of typical electronic devices. For example, remotely locating controller 40 may be preferable for applications where the parameter mapping involves exposing sensors 30 to extreme conditions such as for example high temperatures.

Sensor apparatus 16 also includes, as an option, a substrate 45 for supporting sensors 30. Supporting sensors 30 on substrate 45 allows the array of sensors to be handled as a single unit. This capability may be preferred for some applications. A further use of a substrate 45 may be to provide support for conductors 20 and conductors 25. In some embodiments, conductors 20 and conductors 25 may include patterned lines of conductors fabricated from the deposition of conducting films. For example, conductors 20 and conductors 25 may include electrical conductors fabricated using well known electronic device metallization technologies for electrically connecting electronic devices.

In addition to reducing the complexity of the electrical wiring, embodiments according to the present invention also require fewer electrical ports than are required for some of the standard methods for parameter mapping. Using embodiments of the present invention, the number of electrical ports required for sending electrical signals to the sensors and receiving electrical signals from the sensors equals the sum of the number of input electrical conductors and the number of output electrical conductors.

Specifically, for each of the output electrical conductors the controller may preferably have one electrical port for sending electrical signals to the sensors. Similarly, for each input electrical conductor the controller may preferably have one electrical port for measuring the electrical signal. Consequently, embodiments of the present invention may include 100 sensors and require only 20 electrical ports for sending and receiving electrical signals. For comparison, some of the standard mapping technologies require 200 electrical ports. In other words, embodiments of the present invention can reduce the number of required electrical ports by a factor of up to 10 or greater when compared to the requirements for some of the standard technologies.

Figure 5:
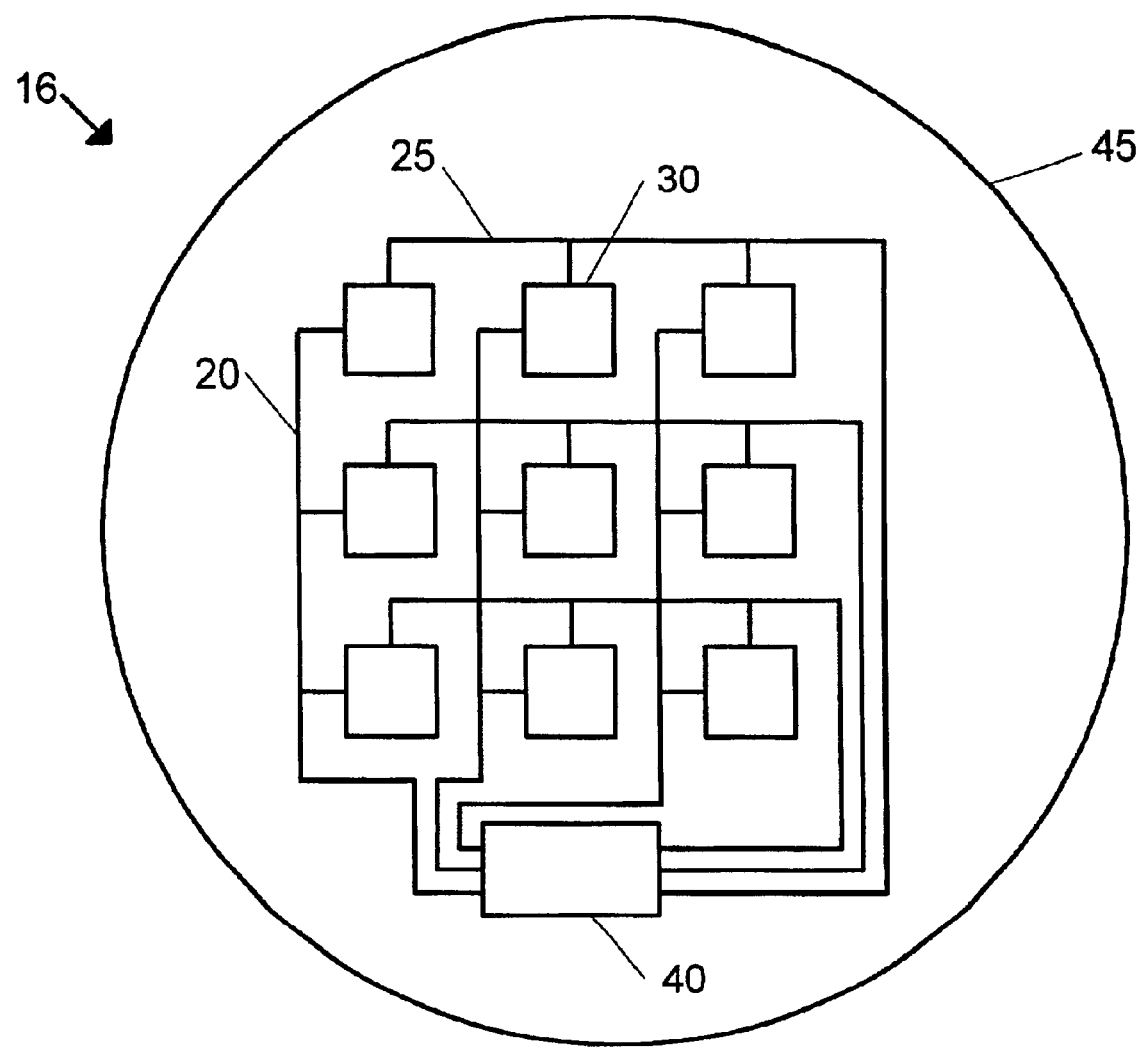
FIG. 5 is a diagram of an embodiment of the present invention.

Reference is now made to FIG. 5 wherein there is shown a top view of an embodiment of the present invention. A sensor apparatus 16 is shown having output electrical conductors 20, input electrical conductors 25, sensors 30, controller 40, and substrate 45. Conductors 20, conductors 25, sensors 30, and substrate 45 are essentially the same as those described for the embodiment shown in FIG. 4. Unlike the embodiment shown in FIG. 4, the embodiment shown in FIG. 5 has controller 40 supported by substrate 45 so that sensors 30 and controller 40 can be handled together as a single unit.

Applications for the embodiment shown in FIG. 5 that involve relatively small substrates such as for example substrates about the size of semiconductor wafers, flatpanel display substrates, and photolithography mask preferably use controller 40 having a suitably small size. For such applications, controller 40 may include a microprocessor and sufficient accessory components for supporting the microprocessor operation for task such as applying electrical signals, measuring electrical signals, processing data, storing data, and transmitting information. Controller 40 is capable of performing the measurements for deriving corrections for parasitic sources.

In preferred embodiments, sensor apparatus 16 further includes capabilities for substantially autonomous operation. Wireless communication capability is a preferred configuration for embodiments of the present invention. Embodiments of the present invention include wireless communication systems such as those based on infrared, microwave, and radio frequency signals. One or more capabilities for autonomous operation of sensor arrays have been described in U.S. patent application Ser. No. 09/643,614 filed Aug. 22, 2000; this application is incorporated herein, in its entirety, by this reference.

The examples presented for embodiments of the present invention illustrated in FIG. 1, FIG. 1a, and FIG. 3 demonstrate the use of aspects of the disclosed invention in a relatively simple form. Specifically, the examples used thermistors that are isolated, linear, two terminal devices. It is to be understood that these examples are not indications of the limits of the present invention. In fact, only the two-terminal characteristic of the example sensors is essential for practicing aspects the present invention.

In preferred embodiments, an electrical impedance property of the sensor is a reproducible function of the parameter to be measured, or there is the capability of representing information from the sensor as an electrical impedance property. The mathematical algorithms used to extract an individual sensor measurement from the matrix of measurements are dependent upon the sensor characteristics. It should be obvious to one of ordinary skill in the art that a variety sensor arrangements and structures can be used in practicing aspects of the present invention.

Another embodiment of the present invention includes sensors having nonlinear impedance characteristics such as semiconductor junctions and/or inversion/depletion layers. Analysis of the data obtained from nonlinear electrical impedance functionality can be achieved using well-known iterative, nonlinear fitting algorithms. In a further embodiment, the data analysis capabilities are incorporated in the controller.

Another embodiment of the present invention includes active sensors such as sensors that include MOSFET structures wherein the device impedance characteristics are modulated or effected by the parameter being measured.

Another embodiment of the present invention includes sensor arrays having different types of sensors within the same network. In this configuration, multiple physical parameters may be measured substantially simultaneously. An example would be sensor arrays that include thermistors and photoconductors on the same network. In preferred embodiments, each sensor structure has well characterized impedance characteristics.

Clearly, embodiments of the present invention can be used for a wide variety of applications that require data acquisition for highly resolved spatial parameter mapping and temporal parameter mapping. Embodiments of the present invention allow the use of large number of sensors and different types of sensors in the same network. The complexity of the electrical wiring for sensor arrays may be substantially reduced when compared to standard methods. Furthermore, embodiments of the present invention allow increased efficiency for the use of computer-related resources for managing the data collection.

Capabilities and features of embodiments of the present invention are particularly suited for applications involving development, optimization, monitoring, and control of processes and process tools used for processing workpieces such as, for example, semiconductor wafers, photolithography mask, and flat panel displays.

Embodiments of the present invention include the capability of providing measurement data from a crosspoint matrix of sensors so that the parasitic current source errors are essentially removed from the data. In other words, embodiments of the present invention are capable of correcting errors imposed by a parasitic current source on the matrix. Depending on the size of the current source, the errors, if uncorrected, can be large enough so as to render the measurement data unusable. In addition, embodiments of the present invention include the capability of removing the supply voltage sensitivity imposed by the parasitic current source.

While there have been described and illustrated specific embodiments of the invention, it will be clear that variations in the details of the embodiments specifically illustrated and described may be made without departing from the true spirit and scope of the invention as defined in the appended claims and their legal equivalents.

What is claimed is:

1. An apparatus comprising:

at least two output electrical conductors;

at least one input electrical conductor;

at least two sensors, the sensors being capable of sensing a parameter and indicating the parameter as an electrical impedance;

the sensors being connected with the output electrical conductors and with the input electrical conductor so as to form an array of crosspoint connections;

a controller, the controller being connected with the output electrical conductors and with the input electrical conductor, the controller being capable of applying electrical signals to the output electrical conductors, the controller being capable of measuring electrical signals received from the input electrical conductor;

the controller being capable of deriving corrections for parasitic sources and calculating the corrected electrical impedance of each of the sensors using an algorithm, information of the electrical signals applied to the output electrical conductors, and measured electrical signals received from the input electrical conductors.

2. The apparatus of claim 1 wherein the at least one input electrical conductor comprises a plurality of input electrical conductors.

3. The apparatus of claim 2 further comprising a substrate for supporting the output electrical conductors, the input electrical conductors, and the sensors.

4. The apparatus of claim 2 further comprising a plurality of reference elements, the reference elements being connected with the output electrical conductors and with the input electrical conductors so as to form crosspoint connections.

5. The apparatus of claim 4 wherein each of the input electrical conductors has at least one reference element connected thereto.

6. The apparatus of claim 1 wherein the algorithm includes equations for summing impedances in series and summing impedances in parallel.

7. The apparatus of claim 1 wherein the sensors are capable of indicating the parameter as an electrical impedance that includes at least one of resistance, capacitance, and inductance.

8. The apparatus of claim 1 wherein the sensors comprise a parameter sensitive resistor.

9. The apparatus of claim 1 wherein the sensors comprise a thermistor.

10. The apparatus of claim 1 wherein the sensors comprise a photoresistor.

11. The apparatus of claim 1 wherein the sensors comprise a nonlinear electronic junction.

12. The apparatus of claim 1 wherein the sensors comprise a photodiode.

13. The apparatus of claim 1 wherein the sensors comprise an active electronic device.

14. The apparatus of claim 1 wherein the sensors comprise a MOSFET device.

15. The apparatus of claim 14 wherein the sensor impedance is a function of a voltage applied to the gate of the MOSFET device.

16. The apparatus of claim 1 wherein the controller comprises a computer.

17. The apparatus of claim 1 wherein the controller comprises a microprocessor.

18. The apparatus of claim 1 further comprising a substrate, and wherein the sensors, the output electrical conductors, and the input electrical conductors are formed on the substrate.

19. The apparatus of claim 1 wherein the plurality of sensors comprise at least two types of sensors.

20. The apparatus of claim 1 wherein at least one of the sensors includes circuitry for converting the measured parameter into a corresponding electrical impedance.

* * * * *